(12) United States Patent
Okumura et al.

(10) Patent No.: US 8,741,459 B2
(45) Date of Patent: Jun. 3, 2014

(54) STATE JUDGING DEVICE AND CONTROL DEVICE OF SECONDARY BATTERY

(75) Inventors: Motoyoshi Okumura, Chiryu (JP); Katsunori Maegawa, Toyohashi (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 604 days.

(21) Appl. No.: 12/731,299

(22) Filed: Mar. 25, 2010

(65) Prior Publication Data

US 2010/0247988 A1    Sep. 30, 2010

(30) Foreign Application Priority Data

Mar. 26, 2009  (JP) ................................. 2009-077459
Jan. 29, 2010  (JP) ................................. 2010-019013

(51) Int. Cl.
*H01M 10/48*     (2006.01)
*H02J 7/00*      (2006.01)

(52) U.S. Cl.
USPC .......................................... 429/90; 320/128

(58) Field of Classification Search
None
See application file for complete search history.

(56) References Cited

U.S. PATENT DOCUMENTS

| 6,486,637 | B1 * | 11/2002 | Nakanishi et al. | 320/150 |
|---|---|---|---|---|
| 2004/0180256 | A1 | 9/2004 | Ikezoe | |
| 2008/0122399 | A1 * | 5/2008 | Nishino et al. | 320/103 |

FOREIGN PATENT DOCUMENTS

| JP | 63-117277 | A |   | 5/1988 |
|---|---|---|---|---|
| JP | 9-257887 | A |   | 10/1997 |
| JP | 2000-30753 | A |   | 1/2000 |
| JP | 2000-40528 | A |   | 2/2000 |
| JP | 2003-308885 | A |   | 10/2003 |
| JP | 2004-273295 | A |   | 9/2004 |
| JP | 2005037230 | A | * | 2/2005 |
| JP | 2007113953 | A | * | 5/2007 |
| KR | 20030031772 | A | * | 4/2003 |

OTHER PUBLICATIONS

Notice of Grounds for Rejection mailed Jan. 7, 2014, issued in corresponding Japanese Patent Application No. 2010-019013, filed Jan. 29, 2010, 6 pages.

* cited by examiner

*Primary Examiner* — Ula C Ruddock
*Assistant Examiner* — Daniel Gatewood
(74) *Attorney, Agent, or Firm* — Christensen O'Connor Johnson Kindness PLLC

(57) ABSTRACT

A device which judges a change of a capacity balance between a cathode and an anode of a secondary battery in a non-destructive manner is provided. The secondary battery has one of the capacities of the cathode and the anode greater than the other capacity. A battery ECU calculates an internal resistance (DCIR) of the secondary battery based on a current and a voltage of the secondary battery. When the calculated internal resistance (DCIR) is higher than the initial state in a low SOC region or a high SOC region, the battery ECU judges that the capacity balance between the cathode and the anode of the secondary battery has changed.

14 Claims, 8 Drawing Sheets

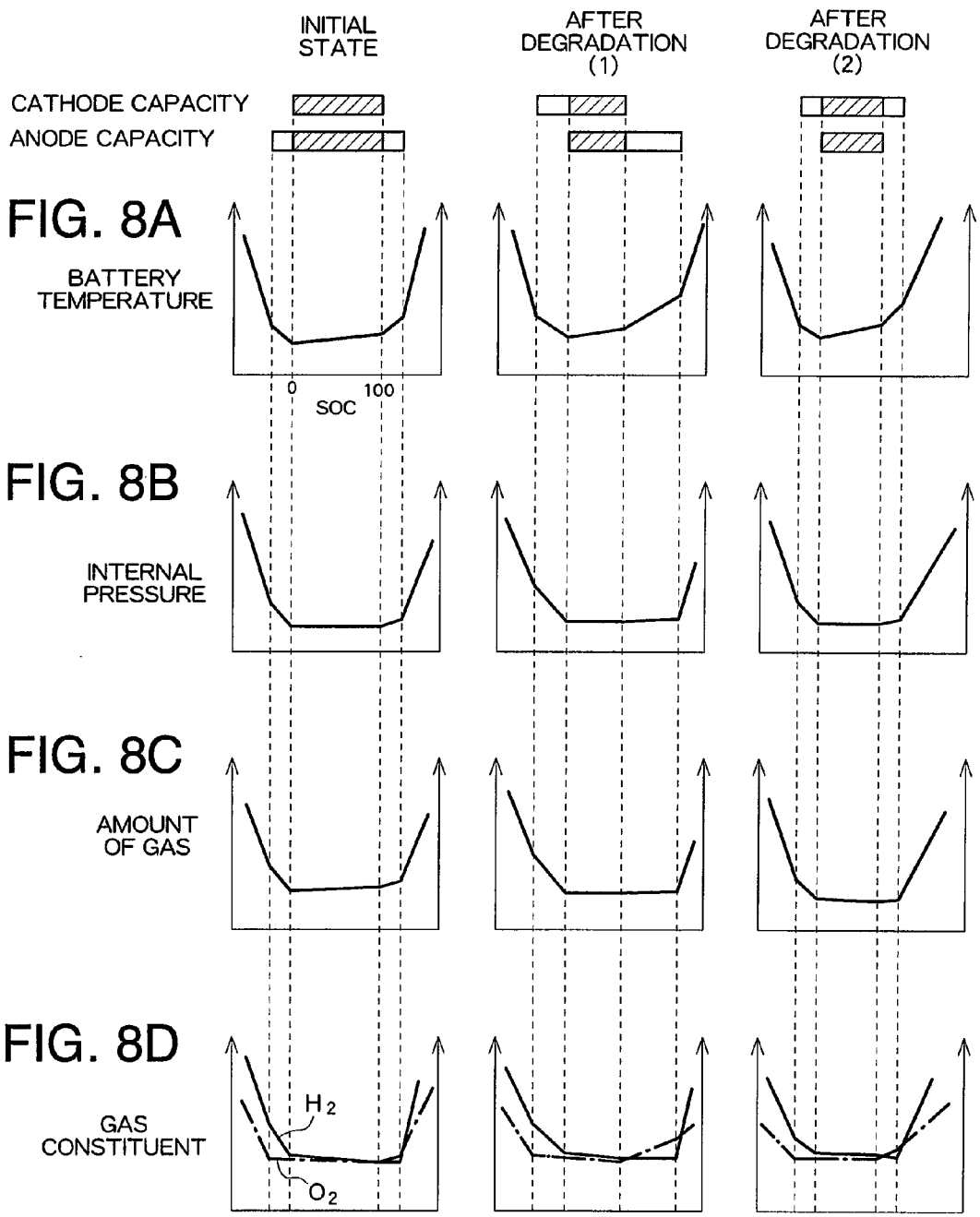

STATE JUDGING DEVICE AND CONTROL DEVICE OF SECONDARY BATTERY

This application claims priority to Japanese Patent Application Nos. 2009-077459, filed on Mar. 26, 2009, and 2010-019013, filed on Jan. 29, 2010, which are incorporated herein by reference in its entirety.

BACKGROUND

1. Technical Field

The present invention relates to a state judging device and a control device of a secondary battery, and in particular, to a device which judges a change in capacity balance in a secondary battery in which a capacity of one of a cathode (positive electrode) and an anode (negative electrode) is regulated.

2. Related Art

A secondary battery such as a nickel-metal hydride battery and a lithium ion battery is used as a power supply for supplying electric power to a drive motor or the like of an electric vehicle and a hybrid electric vehicle.

As the nickel-metal hydride battery, in order to reduce size, weight, and cost of the battery while avoiding an increase in an internal pressure of the battery, a structure is known in which a capacity of an anode is set to be greater than a capacity of a cathode by a predetermined margin capacity, at the time of charging.

JP 2004-273295 A discloses a sealed-type nickel-metal hydride secondary battery comprising a cathode which includes nickel hydroxide as a cathode active material, and an anode which includes a hydrogen absorbing alloy as an anode active material, which has a charge reserve CR which is an excessive capacity which is provided in advance and which is in a non-charged state when charging of the cathode is completed, a discharge reserve DR which is an excessive capacity which is provided in advance and which is in a charged state when discharging of the cathode is completed, and which has a greater capacity than a theoretical capacity of the cathode.

However, in the design of the secondary battery, even if an anode having a greater capacity than the theoretical capacity of the cathode is employed as in JP 2004-273295 A, a capacity balance between the cathode and the anode may change due to aging deterioration of the secondary battery. In the related art, such a change in capacity balance between the cathode and the anode due to the aging deterioration is not considered, and the internal state related to the capacity balance of the secondary battery can only be known by destructing the secondary battery and inspecting with single electrode (capacity measurement).

Even when the capacity of the anode is greater than that of the cathode at the initial state, as a result of the change of the capacity balance due to the aging deterioration, there may be cases where the capacity of the cathode becomes greater than that of the anode, which is an opposite state than at the time of manufacturing. In this case, the capacity (SOC)-voltage curve also changes, and as a result, an error occurs in an SOC estimation value based on the voltage of the secondary battery and the secondary battery cannot be accurately controlled to be charged or discharged.

SUMMARY

An advantage of the present invention is that a device which can easily judge a change in capacity balance between a cathode and an anode in a secondary battery in which a capacity of one of the cathode and the anode is regulated, and a control device for a secondary battery, are provided.

According to one aspect of the present invention, there is provided a state judging device of a secondary battery, comprising a unit which measures a voltage of a secondary battery, a unit which measures a current of the secondary battery, a unit which calculates an internal resistance of the secondary battery based on the voltage and the current, and a unit which judges a change of a capacity balance between a cathode and an anode of the secondary battery based on a change of an SOC dependency of the internal resistance from an initial state.

According to another aspect of the present invention, it is preferable that, in the state judging device, the judging unit judges the change of the capacity balance between the cathode and the anode of the secondary battery based on a change of the internal resistance in at least one of a relatively low SOC region and a relatively high SOC region with respect to the internal resistance in a relatively intermediate SOC region.

According to another aspect of the present invention, it is preferable that, in the state judging device, the judging unit judges the change of the capacity balance between the cathode and the anode of the secondary battery based on a change of the internal resistance in at least one of a relatively low SOC region and a relatively high SOC region with respect to an initial state.

According to another aspect of the present invention, it is preferable that, in the state judging device, the judging unit judges the change of the capacity balance between the cathode and the anode of the secondary battery based on whether or not an amount of change or a percentage of change of the internal resistance in at least one of a relatively low SOC region and a relatively high SOC region with respect to an initial state is greater than or equal to a predetermined value, and whether or not an amount of change or a percentage of change of the internal resistance in a relatively intermediate SOC region with respect to an initial state is less than the predetermined value.

According to another aspect of the present invention, there is provided a state judging device of a secondary battery, comprising a unit which measures a voltage of a secondary battery, a unit which measures a current of the secondary battery, a unit which calculates a no-load voltage of the secondary battery based on the voltage and the current, and a unit which judges a change of a capacity balance between a cathode and an anode of the secondary battery based on a change of an SOC dependency of the no-load voltage from an initial state.

According to another aspect of the present invention, it is preferable that, in the state judging device, the judging unit judges the change of the capacity balance between the cathode and the anode of the secondary battery based on a change of the no-load voltage in a relatively low SOC region with respect to an initial state.

According to another aspect of the present invention, it is preferable that the state judging device further comprises a unit which detects a temperature of the secondary battery, wherein the judging unit judges the change of the capacity balance between the cathode and the anode of the secondary battery when the temperature is less than or equal to a predetermined temperature.

According to another aspect of the present invention, there is provided a control device of a secondary battery, comprising the above-described state judging device, and a unit which changes a manner of controlling charging/discharging of the secondary battery when it is judged that the capacity balance between the cathode and the anode of the secondary battery has changed based on a judgment result by the state judging unit.

According to various aspects of the present invention, the change of the capacity balance between the cathode and the anode of the secondary battery can be judged based on the internal resistance of the no-load voltage. Therefore, the change of the capacity balance due to the aging deterioration can be judged without destroying the secondary battery, and the device can be used for judging degradation of the secondary battery and controlling charging/discharging of the secondary battery.

The present invention can be more clearly understood with reference to the below-described preferred embodiment. However, the below-described preferred embodiment is provided merely for exemplary purposes, and the scope of the present invention is not limited by the preferred embodiment.

BRIEF DESCRIPTION OF THE DRAWINGS

FIG. 8 is a graph showing a battery temperature, an internal pressure, an amount of gas, and a gas constituent after aging deterioration.

DETAILED DESCRIPTION

A preferred embodiment of the present invention will now be described with reference to the drawings.

Figure 1:
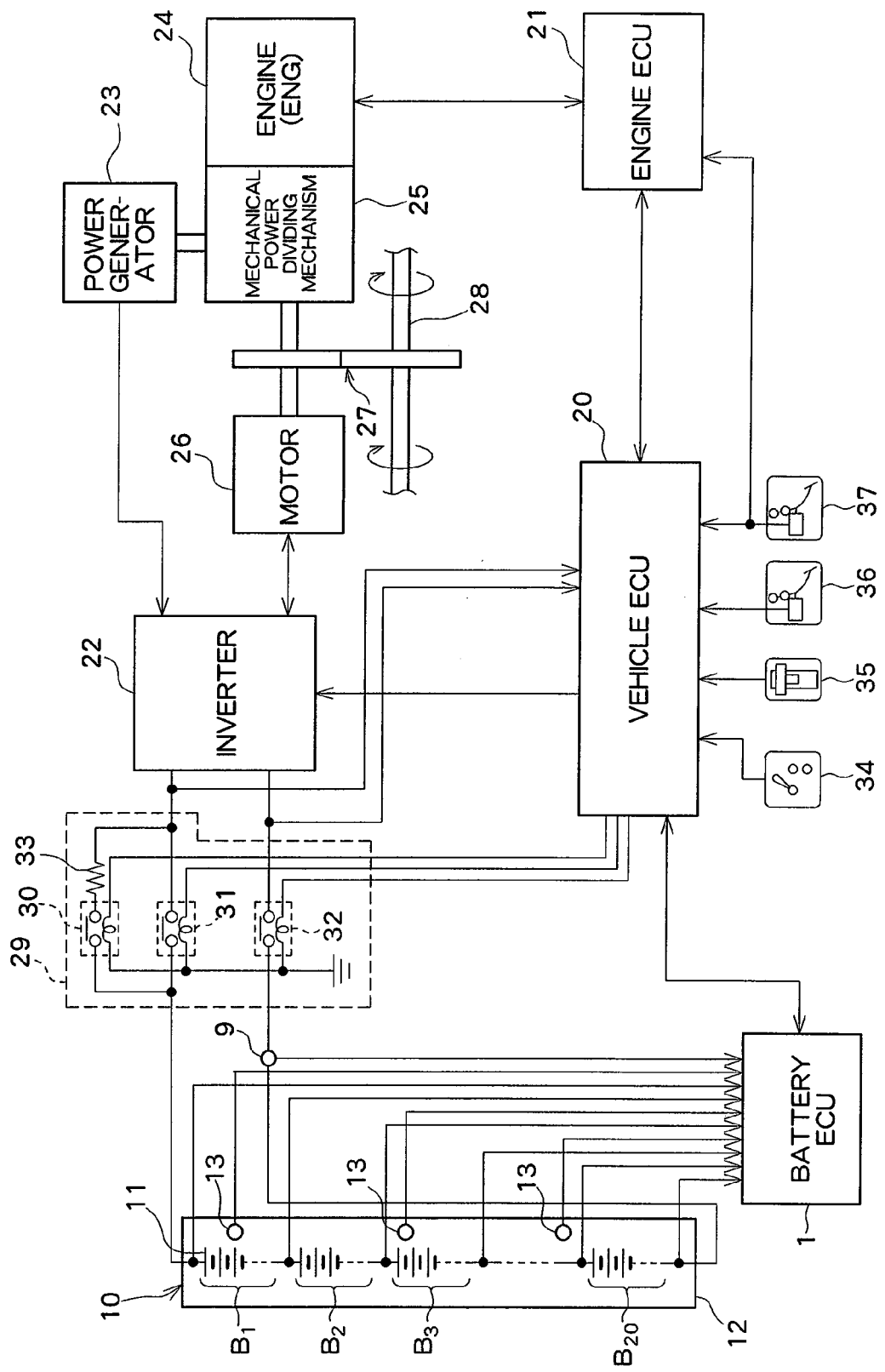
FIG. 1 is a system structure diagram of a preferred embodiment of the present invention.

FIG. 1 is a system structure diagram of a hybrid electric vehicle which is equipped with a control device of a secondary battery according to a preferred embodiment of the present invention. The hybrid electric vehicle comprises an engine 24 and a motor 26 as mechanical power sources for transferring mechanical power to a drive shaft 28. The drive shaft 28 is connected to a wheel. The hybrid electric vehicle comprises a secondary battery 10 as an electric power supply source to the motor 26. The electric power of the secondary battery 10 is supplied via a relay unit 29 and an inverter 22 to the motor 26. The inverter 22 converts DC electric power from the secondary battery 10 into AC electric power, and supplies the converted electric power to the motor 26.

The engine 24 transfers mechanical power via a mechanical power dividing mechanism 25, a decelerator 27, and the drive shaft 28 to the wheel. The motor 26 transfers mechanical power via the decelerator 27 and the drive shaft 28 to the wheel. When charging of the secondary battery 10 is necessary, a part of the mechanical power of the engine 24 is transferred via the mechanical power dividing mechanism 25 to a power generator 23.

Electric power generated by the power generator 23 is supplied via the inverter 22 and the relay unit 29 to the secondary battery 10. At the time of decelerating or braking of the hybrid electric vehicle, the motor 26 is used as a power generator (regenerative braking). The electric power generated by the motor 26 is also supplied via the inverter 22 and the relay unit 29 to the secondary battery 10.

The relay unit 29 comprises relays 30~32, and a resistor 33. The relay 31 is connected between a cathode terminal of the secondary battery 10 and a high-potential input terminal of the inverter 22. The relay 32 is connected between an anode terminal of the secondary battery 10 and a low-potential input terminal of the inverter 22. The relay 30 is connected in series to the resistor 33 and in parallel to the relay 31. The relay 30 pre-charges an averaging capacitor of the inverter 22 at a startup of the vehicle, along with the resistor 33.

An engine ECU 21 controls an ignition timing of the engine 24, an amount of fuel ejection, etc.

A battery ECU 1 detects a voltage and a current of the secondary battery 10, and estimates an SOC (State of Charge) of the secondary battery 10 based on these detected values.

A vehicle ECU 20 controls the inverter 22 and the operation of the motor 26 based on information supplied from the battery ECU 1, the engine ECU 21, etc. The information supplied from the engine ECU 21 includes, for example, an operation state of the engine 24, a rotational angle of a crank shaft, or the like. The information supplied from the battery ECU 1 includes, for example, the SOC of the secondary battery 10 or the like. An amount of operation of an acceleration pedal 37, an amount of operation of a braking pedal 36, and various information of a shift range selected by a shift lever 35 are also supplied to the vehicle ECU 20.

The secondary battery 10 is constructed by connecting battery blocks B1~B20 in series. The battery blocks B1~B20 are stored in a battery case 12. Each of the battery blocks B1~B20 is constructed by electrically connecting a plurality of battery modules in series, and each battery module is constructed by electrically connecting a plurality (for example, 6) of cells 11 in series. Each cell 11 is a nickel-metal hydride battery, and is a battery having one of capacities of the cathode and the anode greater than the other capacity at the time of design, that is, in an initial state. In the present embodiment, the cell 11 comprises a cathode which includes nickel hydroxide as a cathode active material, and an anode which includes a hydrogen absorbing alloy as an anode active material, which has a charge reserve which is an excessive capacity which is provided in advance and which is in a non-charged state when charging of the cathode is completed, and a discharge reserve which is an excessive capacity which is provided in advance and which is in a charged state when discharging of the cathode is completed, and which has a greater capacity than a theoretical capacity of the cathode. A plurality of temperature sensors 13 are placed in the battery case 12.

Figure 2:
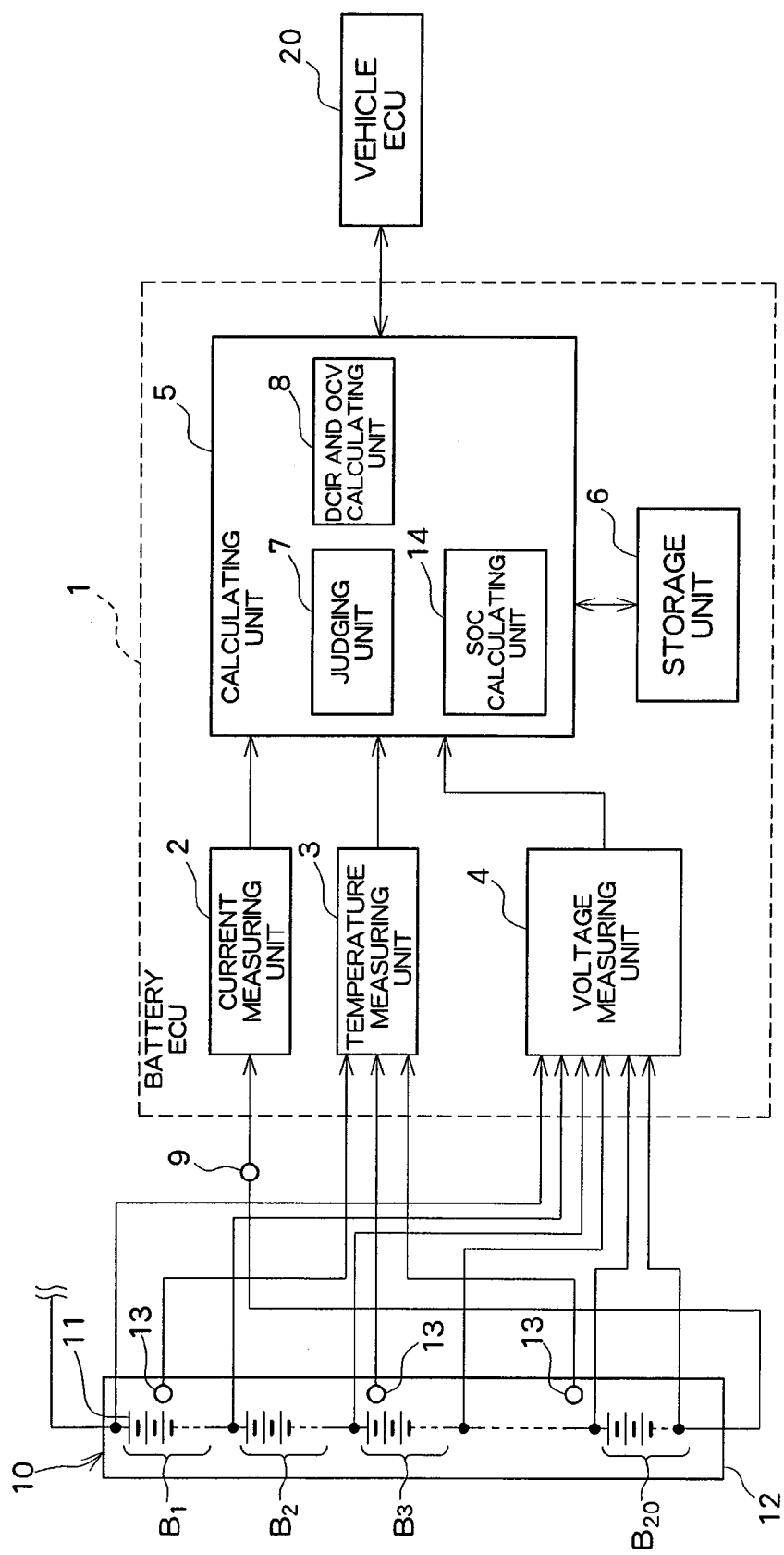
FIG. 2 is a structural diagram of the battery ECU in FIG. 1.

FIG. 2 shows a structure of the battery ECU 1 in FIG. 1. The battery ECU 1 comprises a current measuring unit 2, a voltage measuring unit 4, a temperature measuring unit 3, a calculating unit 5, and a storage unit 6.

The voltage measuring unit 4 measures the voltage of the secondary battery 10. More specifically, the voltage measuring unit 4 measures the voltage of each of the battery blocks B1~B20. In addition, the voltage measuring unit 4 converts the voltage for each battery block into a digital signal, and generates voltage data specifying the voltage of each battery block. The voltage measuring unit 4 outputs the voltage data to the calculating unit 5. The output of the voltage data by the voltage measuring unit 4 to the calculating unit 5 is periodically executed at a preset period.

The current measuring unit 2 measures a current value I during charging/discharging of the secondary battery 10 based on a signal which is output from a current sensor 9. The current measuring unit 2 converts an analog signal which is output by the current sensor 9 into a digital signal, and outputs to the calculating unit 5 as current data. The output of the current data by the current measuring unit 2 to the calculating unit 5 is also periodically executed at a preset period. The detection timing of the voltage data and the detection timing of the current data are identical to each other.

The temperature measuring unit 3 measures the temperature of the secondary battery 10. The temperature measuring unit 3 converts an analog signal which is output from each temperature sensor 13 provided in each group in the battery case 12 into a digital signal, to generate temperature data, and outputs to the calculating unit 5.

The calculating unit 5 comprises a judging unit 7, an internal resistance (DCIR) and no-load voltage (OCV) calculating unit 8, and an SOC calculating unit 14.

The internal resistance (DCIR) and no-load voltage (OCV) calculating unit 8 calculates an internal resistance (DCIR) of the secondary battery 10 based on the voltage data from the voltage measuring unit 4 and the current data from the current measuring unit 2. More specifically, the internal resistance (DCIR) and no-load voltage calculating unit 8 obtains a plurality of pair data of a voltage value of a terminal voltage and a current value during charging/discharging for each battery block based on the voltage data from the voltage measuring unit 4 and the current data from the current measuring unit 2, and stores the obtained pair data in the storage unit 6. The internal resistance (DCIR) and no-load voltage calculating unit 8 calculates the internal resistance (DCIR) based on a percentage of change of the plurality of pair data stored in the storage unit 6, that is, a slope of an approximated straight line of first order (V-I approximated straight line) of the plurality of pair data when the current value is represented on the horizontal axis and the voltage value is represented on the vertical axis. In addition, the internal resistance (DCIR) and no-load voltage calculating unit 8 calculates a V intercept of the V-I approximated straight line as the no-load voltage (OCV).

The SOC calculating unit 14 refers to a two-dimensional map which defines a relationship between the no-load voltage and the SOC and which is stored in the storage unit 6 in advance, to calculate the SOC corresponding to the calculated no-load voltage OCV.

The judging unit 7 judges whether or not a change (degradation) has occurred in the capacity balance between the cathode and the anode of the secondary battery 10 based on the relationship between the calculated internal resistance DCIR or no-load voltage OCV and the SOC. The change of the capacity balance includes a case where the size relationship of capacities between the cathode and the anode is reversed, for example, a case where the relationship is (capacity of cathode)<(capacity of anode) in the initial state and the relationship is changed to (capacity of cathode) (capacity of anode), and a case where the size relationship does not change, but the difference in capacity between the electrodes is reduced by a value greater than or equal to a predetermined value. When the judging unit 7 judges that a change (degradation) has occurred in the capacity balance of the secondary battery 10, the battery ECU 1 changes a manner of controlling the secondary battery 10.

The capacity balances between the cathode and the anode of the secondary battery 10 in the initial state and after aging deterioration will now be described.

Figure 3A:
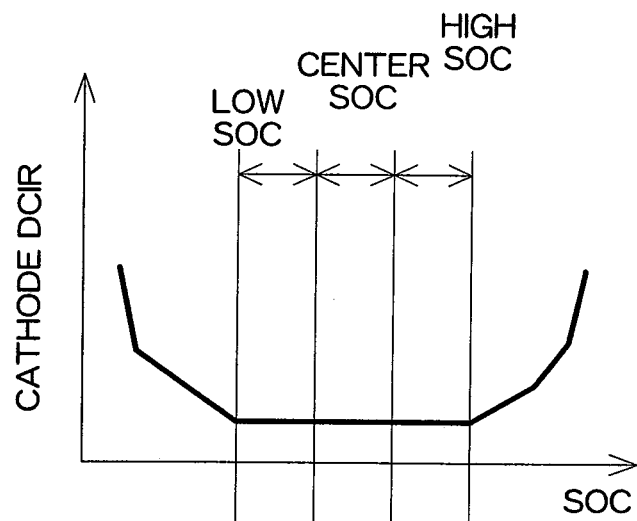
FIG. 3 is a graph showing an internal resistance (DCIR) in an initial state.
Figure 3B:
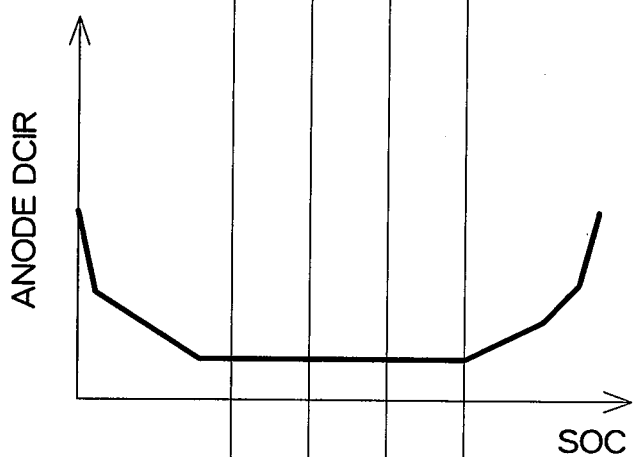
Figure 3C:
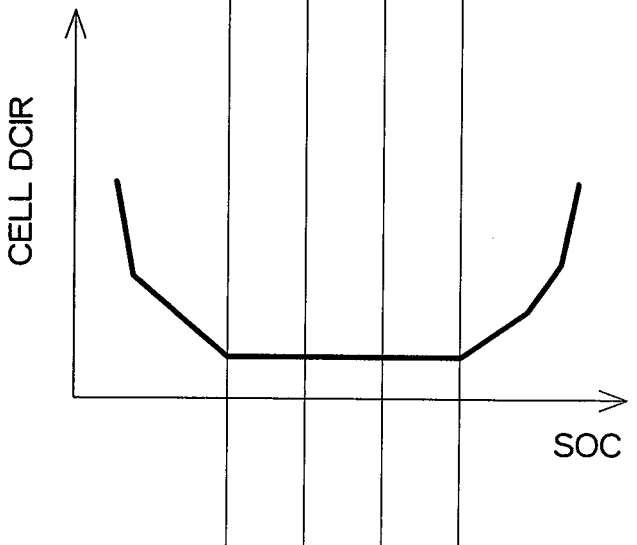

FIG. 3 shows the internal resistance DCIR of the cell 11 belonging to the battery block which is a part of the secondary battery 10 in the initial state. FIG. 3A shows the internal resistance DCIR on the cathode side, FIG. 3B shows the internal resistance DCIR on the anode side, and FIG. 3C shows the internal resistance DCIR of the overall cell 11 (cell).

FIGS. 3A, 3B, and 3C are measured in the following manner. A cell 11 belonging to the battery block (B1~B20) which is a part of the secondary battery 10 in the initial state is prepared. A hole is opened at an upper portion of the cell, and an electrolyte is replenished. A Hg/HgO reference electrode is immersed into the hole, to set a configuration such that a potential of the cathode, a potential of the anode, and a cell terminal voltage with respect to the reference electrode can be measured.

First, after the cell is charged to an SOC of 80%, the cell is left for a predetermined time period. Then, under a constant temperature environment of 25° C., 5 cycles of a charging/discharging cycle in which "the cell is discharged for 5 seconds with a predetermined current value, left for 60 seconds, charged for 5 seconds with a predetermined current value, and left for 60 seconds" are executed. In the present embodiment, the predetermined current value is changed for each cycle in the order of 1 C, 2 C, 5 C, 10 C, and 15 C, and the charging/discharging process is executed for 5 cycles. In each charging/discharging cycle, the potential of the cathode, the potential of the anode, and the cell terminal voltage are measured immediately after the cell is charged for 5 seconds.

Then, the measured values are plotted in graphs representing the current value on the horizontal axis and one of the potential of the cathode, the potential of the anode, and the cell terminal voltage on the vertical axis. Then, using a method of least squares, a slope of a straight line corresponding to the plotted data is calculated, and the cathode DCIR (FIG. 3A), the anode DCIR (FIG. 3B), and the cell DCIR (FIG. 3C) at the SOC of 80% are calculated based on the calculated slope.

The SOC is then stepwise reduced to 20%, and the cathode DCIR (FIG. 3A), the anode DCIR (FIG. 3B), and the cell DCIR (FIG. 3C) are calculated at the SOC of each step in a manner similar to the case of the SOC of 80%. The cell DCIR (FIG. 3C) approximately corresponds to DCIR (per cell) of the battery block in the initial state calculated by the internal resistance (DCIR) calculating unit 8 of the calculating unit 5 in the hybrid electric vehicle.

In these drawings, the horizontal axis represents the SOC and the vertical axis represents the internal resistance DCIR. On both the cathode side and the anode side, the internal resistance DCIR is higher in a region where the SOC is excessively high and a region where the SOC is excessively low. In an intermediate region between the region where the SOC is excessively high and the region where the SOC is excessively low, the internal resistance DCIR is approximately constant. Normally, the secondary battery 10 is used in the SOC region where the internal resistance DCIR is approximately constant. The SOC region (normally, region of SOC of 20%~80%) where the internal resistance DCIR is approximately constant is further divided into a relatively intermediate SOC region (central SOC region; for example, SOC of 40%~60%), a relatively high SOC region (for example, SOC of 60%~80%), and a relatively low SOC region (for example, SOC of 20%~40%). In both the cathode DCIR shown in FIG. 3A and the anode DCIR shown in FIG. 3B, the internal resistance DCIR is approximately constant at the initial state in any of the intermediate SOC region, the high SOC region, and the low SOC region. As described above, the cell 11 of the secondary battery 10 has the anode with a greater capacity than the theoretical capacity of the cathode. Therefore, when FIGS. 3A and 3B are compared, FIG. 3B has a wider SOC region. In other words, the cell of the present embodiment is cathode regulated. Because the internal resistance DCIR is constant in any of the intermediate SOC region, the high SOC region, and the low SOC region on both the cathode side and the anode side, in the cell 11 as a whole, the internal resistance DCIR is constant in any of the intermediate SOC region, the high SOC region, and the low SOC region, as shown in FIG. 3C. That is, the internal resistance (DCIR) calculated by the internal resistance (DCIR) calculating unit 8 of the calculating unit 5 is approximately constant regardless of the value of the SOC calculated by the SOC calculating unit 14.

Figure 4A:
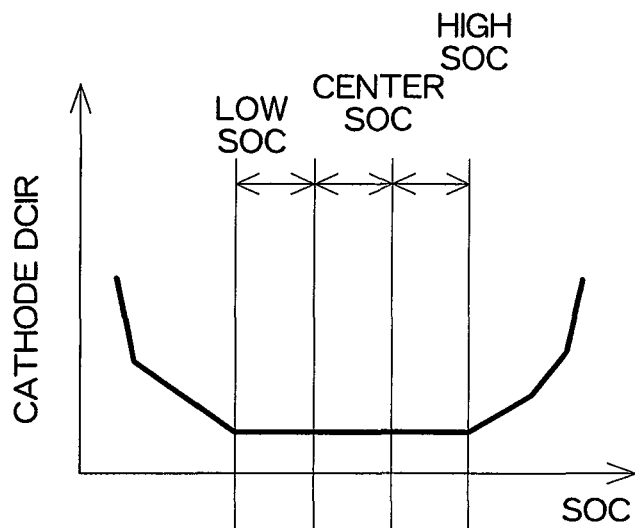
FIG. 4 is a graph showing an internal resistance (DCIR) after aging deterioration.
Figure 4B:
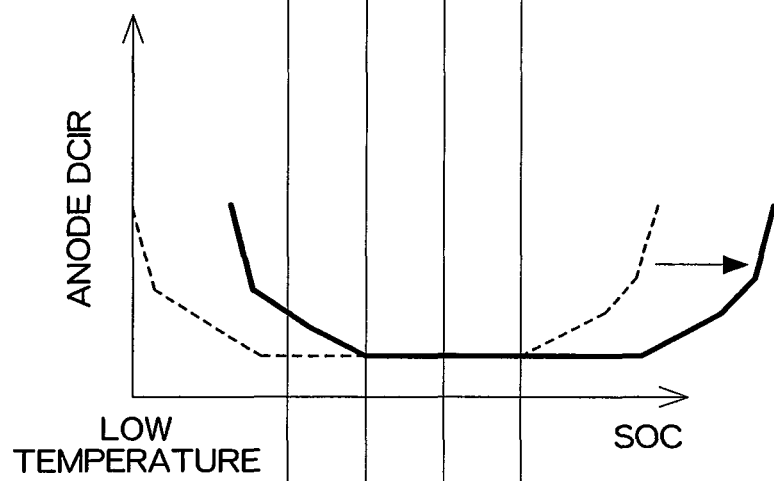
Figure 4C:
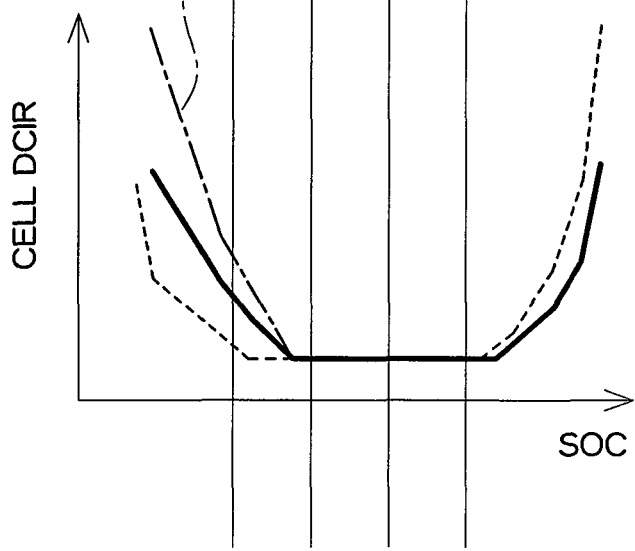

FIG. 4 shows the internal resistance DCIR of the cell 11 after aged deterioration. Similar to the case of the initial state, in FIGS. 4A, 4B, and 4C, a cell after aging deterioration is prepared, and the cathode DCIR (FIG. 4A), the anode DCIR (FIG. 4B), and the cell DCIR (FIG. 4C) are calculated at various SOCs based on values of the cathode potential, the anode potential, and the cell terminal voltage. The cell DCIR (FIG. 4C) approximately corresponds to the DCIR (per cell) of the battery block after aging deterioration which is calculated by the internal resistance (DCIR) calculating unit 8 of the calculating unit 5 in the hybrid electric vehicle. FIG. 4A shows the internal resistance DCIR on the cathode side, FIG. 4B shows the internal resistance DCIR of the anode side, and FIG. 4C shows the internal resistance DCIR of the overall cell 11. As shown in FIG. 4A, the internal resistance (DCIR) on the cathode side does not change significantly from the initial state, but as shown in FIG. 4B, a characteristic of the internal resistance DCIR on the anode side is shifted toward a high SOC side. In FIG. 4, a dotted line represents a characteristic in the initial state and a solid line represents a characteristic after aged deterioration. The shown configuration is merely exemplary, and depending on the usage situation of the secondary battery 10, the characteristic of the internal resistance DCIR on the anode side may be shifted toward the low SOC side. In the cell 11 as a whole (cell), the characteristic is as shown in FIG. 4C, and the internal resistance DCIR is approximately constant in the intermediate SOC region and the high SOC region, but is higher in the low SOC region compared to the internal resistance DCIR of the intermediate SOC region or the high SOC region because of an influence of the higher internal resistance DCIR on the anode side. Therefore, the internal resistance DCIR calculated by the internal resistance (DCIR) calculating unit 8 of the calculating unit 5 changes depending on the value of SOC calculated by the SOC calculating unit 14, and the internal resistance DCIR calculated at the low SOC is greater than the internal resistance DCIR calculated at the intermediate SOC or high SOC. The judging unit 7 of the calculating unit 5 can judge whether or not the capacity balance between the cathode and the anode of the cell 11 has changed based on whether or not there is such an SOC dependency of the internal resistance DCIR, more specifically, whether or not the internal resistance DCIR in the low SOC region is higher compared to the internal resistance DCIR in the intermediate SOC region of the high SOC region. More specifically, the judging unit 7 compares in size the internal resistance DCIR in the low SOC region (for example, about 30%) with a predetermined value, and judges that the capacity balance has changed when the internal resistance DCIR in the low SOC region becomes greater than or equal to the predetermined value. Alternatively, the judging unit 7 may compare a difference between the internal resistance DCIR in the low SOC region and the internal resistance DCIR in the intermediate SOC region (for example, 50%) with a threshold value, and judge that the capacity balance has changed when the difference becomes greater than or equal to the threshold value. Alternatively, the judging unit 7 may store, in the storage unit 6, the internal resistance DCIR at the initial state in the low SOC region, compare a difference between the current internal resistance DCIR in the low SOC region and the internal resistance DCIR at the initial state with a threshold value, and judge that the capacity balance has changed when the difference becomes greater than or equal to the threshold value. Alternatively, the judging unit 7 may compare in size a percentage of change of the internal resistance DCIR in the low SOC region with a threshold value. For example, the percentages of change between the internal resistance DCIR at the SOC of 20% which is in the low SOC region and the internal resistance DCIR at the SOC of 30% which is in the low SOC region may be calculated, and the judging unit 7 may judge that the capacity balance has changed when the percentage of change is greater than or equal to a threshold value.

FIG. 4C also shows a characteristic of the internal resistance DCIR under a low temperature condition, with a dot-and-chain line. Under the low temperature condition, the internal resistance DCIR on the anode side is increased to a greater degree, and thus the tendency of the increase in the internal resistance DCIR in the low SOC region becomes more significant. Therefore, under the low temperature condition, the change of the capacity balance between the cathode and the anode can be more clearly judged.

Figure 5A:
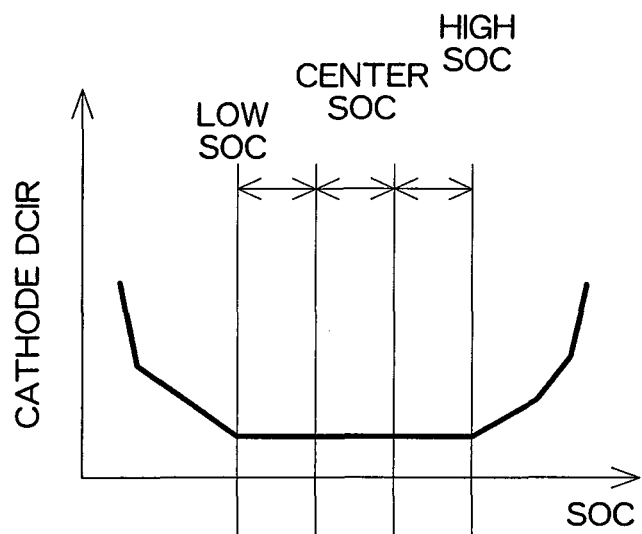
FIG. 5 is a graph showing another internal resistance (DCIR) after aging degradation.
Figure 5B:
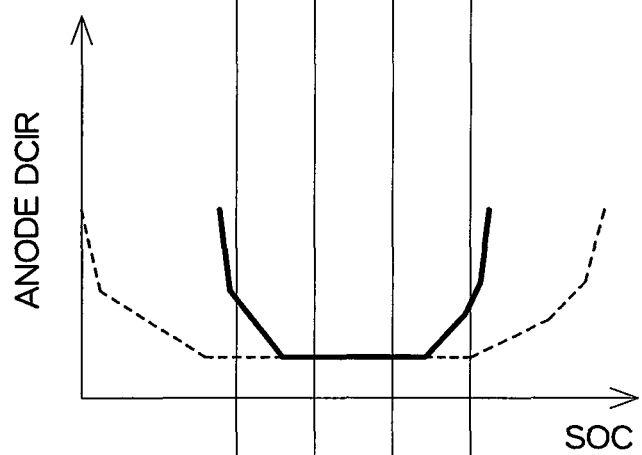
Figure 5C:
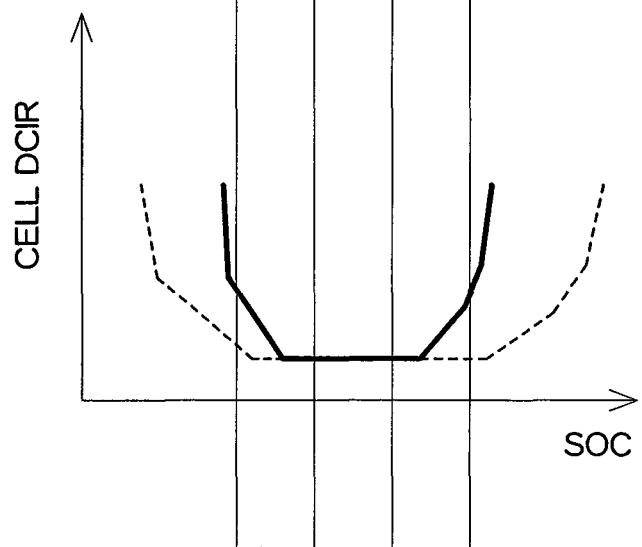

FIG. 5 shows another change of the internal resistance DCIR of the cell 11 after aging deterioration. In FIGS. 5A, 5B, and 5C, similar to the case of the initial state, another cell after the aging degradation is prepared, and the cathode DCIR (FIG. 5A), the anode DCIR (FIG. 5B), and the cell DCIR (FIG. 5C) at various SOCs are calculated based on values of the cathode potential, the anode potential, and the cell terminal voltage. The cell DCIR (FIG. 5C) approximately corresponds to the DCIR (per cell) of the battery block after aging deterioration calculated by the internal resistance (DCIR) calculating unit 8 of the calculating unit 5 in the hybrid electric vehicle. FIG. 5A shows the internal resistance DCIR on the cathode side, FIG. 5B shows the internal resistance DCIR on the anode side, and FIG. 5C shows the internal resistance DCIR of the overall cell 11. As shown in FIG. 5A, the internal resistance (DCIR) on the cathode side does not significantly change from the initial state, but as shown in FIG. 5B, the characteristic of the internal resistance DCIR on the anode side changes due to the capacity reduction. In FIG. 5, the dotted line represents the characteristic in the initial state, and the solid line represents the characteristic after the aging deterioration. In the cell 11 as a whole (cell), the characteristic is as shown in FIG. 5C, and the internal resistance DCIR is approximately constant in the intermediate SOC region, but is higher in the low SOC region and the high SOC region compared to the internal resistance DCIR in the intermediate SOC region due to an influence of the higher internal resistance DCIR on the anode side. Therefore, the internal resistance DCIR calculated by the internal resistance (DCIR) and no-load voltage (OCV) calculating unit 8 of the calculating unit 5 changes depending on the value of the SOC calculated by the SOC calculating unit 14, and the internal resistance DCIR calculated in the low SOC region or the high SOC region is higher than the internal resistance DCIR calculated in the intermediate SOC region. The judging unit 7 of the calculating unit 5 can judge whether or not the capacity balance between the cathode and the anode of the cell 11 has changed based on whether or not there is such an SOC dependency of the internal resistance DCIR, more specifically, whether or not the internal resistance DCIR in the low SOC region or in the high SOC region is higher than the internal resistance DCIR in the intermediate SOC region. Alternatively, the judging unit 7 may compare in size a difference between the internal resistance DCIR in the low SOC region or the high SOC region and the internal resistance DCIR in the intermediate SOC region (for example, 50%) with a threshold value, and judge that the capacity balance has changed when the difference becomes greater than or equal to the threshold value. Alternatively, the judging unit 7 may store the internal resistance DCIR in the low SOC region or the high SOC region in the initial state in the storage unit 6, compare a difference between the current internal resistance DCIR in the low SOC region or the high SOC region and the internal resistance DCIR in the initial state with a threshold value, and judge that the capacity balance has changed when the difference becomes greater than or equal to the threshold value. Alternatively, the judging unit 7 may compare in size a percentage of change of the internal resistance DCIR in the low SOC region or the high SOC region with a threshold value. For example, the judging unit 7 may calculate a percentage of change between the internal resistance DCIR at an SOC of 20% which is in the low SOC region and the internal resistance DCIR at an SOC of 30% which is in the low SOC region, and judge that the capacity balance has changed when the percentage of change is greater than or equal to a threshold value. Alternatively, the judging unit 7 may calculate the percentage of change from the initial state in the low SOC region or the high SOC region and the percentage of change from the initial state in the intermediate SOC region, and judge that the capacity balance has changed when the percentage of change from the initial state in the low SOC region or the high SOC region is greater than or equal to a predetermined value and the percentage of change from the initial state in the intermediate SOC region is less than a predetermined value. In place of the percentage of change, it is also possible to use an amount of change from the initial state.

In this manner, the change of the capacity balance between the cathode and the anode can be detected using the internal resistance DCIR of the battery block which is calculated by the internal resistance (DCIR) calculating unit 8 of the calculating unit 5 of the hybrid vehicle. Alternatively, it is also possible to use a no-load voltage OCV in place of the internal resistance DCIR.

Figure 6A:
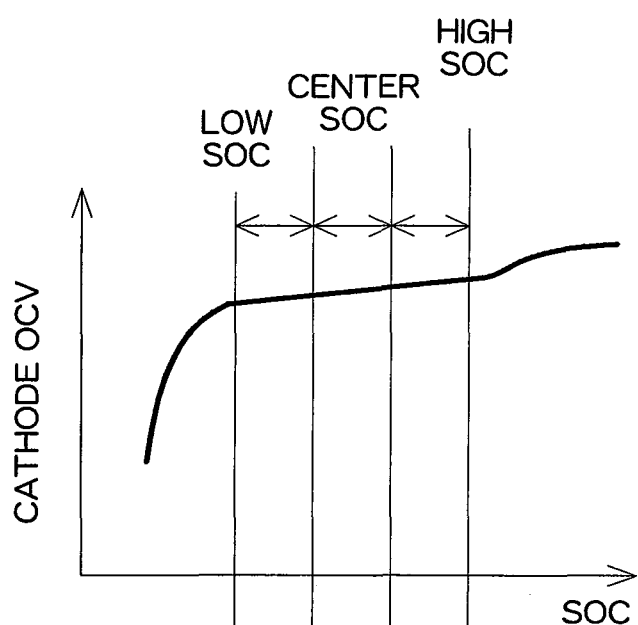
FIG. 6 is a graph showing a relationship of SOC-no-load voltage OCV in the initial state.
Figure 6B:
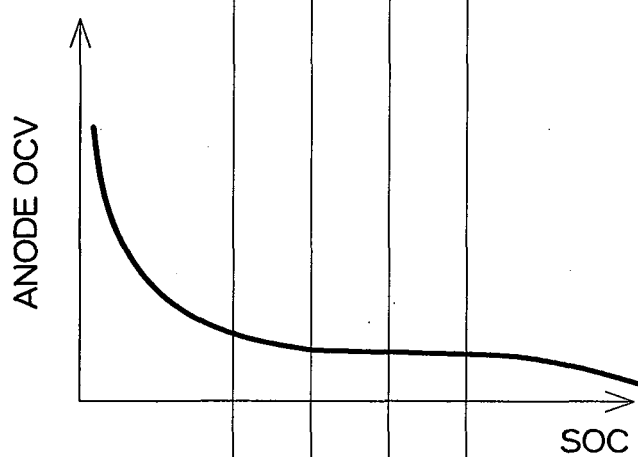
Figure 6C:
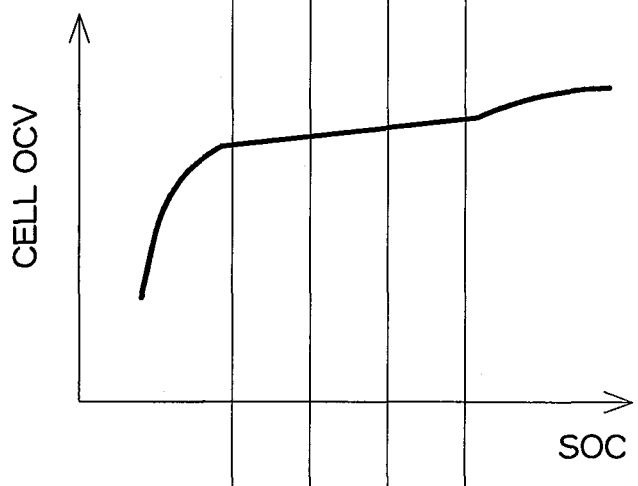

FIG. 6 shows a relationship between the no-load voltage OCV and SOC at the initial state. FIGS. 6A, 6B, and 6C are measured, for example, in the following manner.

A cell 11 belonging to a battery block (B1~B20) forming a part of a secondary battery 10 in the initial state is prepared. A hole is opened on an upper portion of the cell, and an electrolyte is replenished. A Hg/HgO reference electrode is immersed into the hole, and a configuration is set such that a cathode potential, an anode potential, and a cell terminal voltage with respect to the reference electrode can be measured.

After the cell is charged to an SOC of 80%, the cell is left for a predetermined time period. Then, under a constant temperature environment of 25° C., 5 cycles of charging/discharging cycle in which "the cell is discharged for 5 seconds with a predetermined current value, left for 60 seconds, charged for 5 seconds with a predetermined current value, and left for 60 seconds" are executed. In the present embodiment, the predetermined current value is changed for each cycle in the order to 1 C, 2 C, 5 C, 10 C, and 15 C, and 5 cycles of charging/discharging are executed. In each charging/discharging cycle, the cathode potential, the anode potential, and the cell terminal voltage immediately after charging of 5 seconds are measured.

Then, the measured values are plotted in a graph representing the current value on the horizontal axis and one of the cathode potential, the anode potential, and the cell terminal voltage on the vertical axis. Next, using a method of least squares, an intercept of a straight line corresponding to the plotted data at the time of current of zero is calculated, and the calculated intercept is calculated as the cathode OCV (FIG. 6A), the anode OCV (FIG. 6B), or the cell OCV (FIG. 6C) at the SOC of 80%.

Then, the SOC is stepwise reduced to 20%, and at the SOC of each step, the cathode OCV (FIG. 6A), the anode OCV (FIG. 6B), and the cell OCV (FIG. 6C) are calculated in a manner similar to the above-described case of SOC of 80%. The cell OCV (FIG. 6C) approximately corresponds to an OCV (per cell) of the battery block in the initial state calculated by the OCV calculating unit 8 of the calculating unit 5 of the hybrid electric vehicle.

FIG. 6A shows a relationship on the cathode side, FIG. 6B shows a relationship on the anode side, and FIG. 6C shows a relationship in the cell 11 as a whole (cell). In these figures, the horizontal axis represents SOC and the vertical axis represents the no-load voltage OCV. As describe above, the no-load voltage OCV calculated by the OCV calculating unit 8 of the calculating unit 5 is calculated as a V intercept of the V-I approximated straight line obtained by recursively analyzing the pair data of the voltage data and the current data. As shown in FIG. 6C, in the initial state, the no-load voltage OCV of the overall cell 11 is gradually increased with respect to the SOC in any of the intermediate SOC region, the high SOC region, and the low SOC region.

Figure 7A:
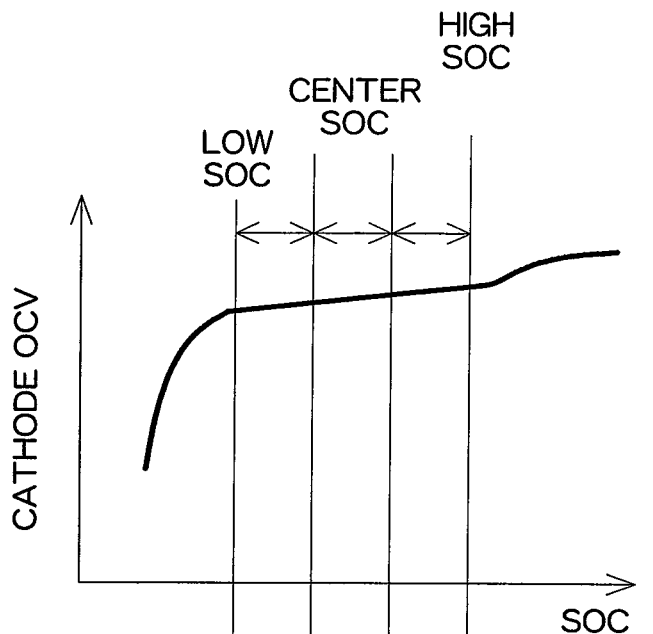
FIG. 7 is a graph showing a relationship of SOC-no-load voltage OCV after aging deterioration.
Figure 7B:
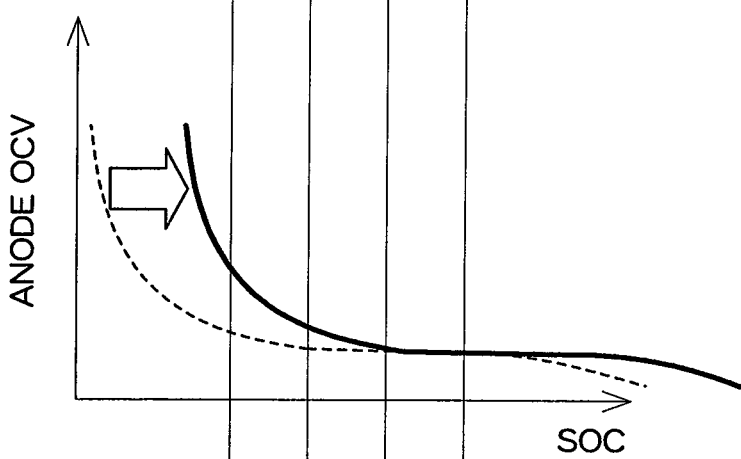
Figure 7C:
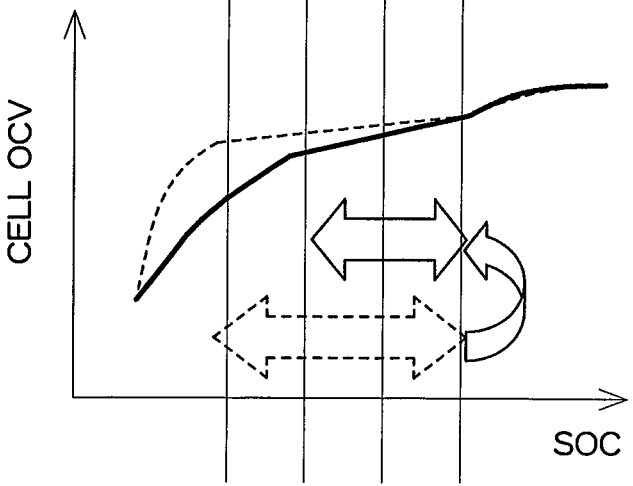

FIG. 7 shows a relationship between the no-load voltage OCV and the SOC of a cell 11 after aging deterioration. In FIGS. 7A, 7B, and 7C, similar to the case of the initial state, a cell after aging deterioration is prepared, and the cathode OCV (FIG. 7A), the anode OCV (FIG. 7B), and the cell OCV (FIG. 7C) are calculated based on values of the cathode no-load potential, the anode no-load potential, and the cell no-load voltage. The cell OCV (FIG. 7C) approximately corresponds to the OCV (per cell) of the battery block after aging deterioration which is calculated by the OCV calculating unit 8 of the calculating unit 5 in the hybrid electric vehicle. FIG. 7A shows a relationship on the cathode side, FIG. 7B shows a relationship on the anode side, and FIG. 7C shows a relationship for the cell 11 as a whole (cell). Although the relationship on the cathode side does not change, the relationship between the no-load voltage and the SOC changes due to the change in the capacity on the anode side. In the figures, the dotted line represents the characteristic in the initial state and the solid line represents the characteristic after aged deterioration. Therefore, the characteristic of the cell 11 as a whole also changes as shown in FIG. 7C, and in particular, the no-load voltage OCV is reduced in the low SOC region. The judging unit 7 calculates a percentage of change from the initial state in the low SOC region and a percentage of change from the initial state in the intermediate SOC region, and judges that the capacity balance has changed when the percentage of change from the initial state in the low SOC region is greater than or equal to a predetermined value and the percentage of change from the initial state in the intermediate SOC region is less than a predetermined value. Alternatively, it is also possible to use an amount of change in place of the percentage of change. Because the no-load voltage OCV changes due to the aging deterioration, the SOC cannot be calculated using the two-dimensional map which is stored in the storage unit 6 in advance and which defines the relationship between the no-load voltage and the SOC, when the no-load voltage in the low SOC region and the no-load voltage in the intermediate region is to be calculated, and thus the SOC is estimated through other known methods, for example, a method of integrating the current of the secondary battery 10.

As described, the change of the capacity balance between the cathode and the anode due to the aging deterioration of the cell 11 can be detected as the change of the internal resistance DCIR with respect to the SOC calculated by the calculating unit 5 of the hybrid electric vehicle or the change of the no-load voltage OCV. The judging unit 7 judges whether or not a change has occurred in the capacity balance between the cathode and the anode for each battery block of the secondary battery 10 based on the internal resistance DCIR or the no-load voltage OCV. When there is no change in the capacity balance, there is no problem. On the other hand, when a change has occurred in the capacity balance, there is a possibility that the precision of the charging/discharging control of the secondary battery 10 is affected and degradation may be promoted by excessive discharge. Therefore, the charging/discharging control of the secondary battery 10 is adaptively changed according to the change of the capacity balance.

For example, the battery ECU 1 calculates the current SOC of the secondary battery 10 by referring to the two-dimensional map of the no-load voltage OCV and the SOC which is stored in the storage unit 6, and controls the charging/discharging of the secondary battery 10 based on the calculated SOC. However, because the two-dimensional map is a map which assumes that the capacity balance of the secondary battery 10 is in the initial state, that is, in a state at the time of design, if the capacity balance changes due to the aging deterioration, the SOC calculated using the two-dimensional map would be different from the actual SOC. If the charging/discharging control of the secondary battery 10 is applied based on the calculated SOC, an abnormal state such as excessive discharge may be caused because the control is not a control based on the actual SOC.

In consideration of this, when it is judged that the capacity balance of the secondary battery 10 has changed, the SOC calculating unit 14 changes the application range of the two-dimensional map of the no-load voltage OCV and the SOC stored in the storage unit 6, to correspond to the change of the capacity balance. In other words, as shown in FIG. 7C, the SOC range where the two-dimensional map can be applied is limited from the range shown with the arrow of the dotted line in FIG. 7C to the range shown with the arrow of the solid line in FIG. 7C. When the capacity balance changes, a difference occurs between the SOC in the initial state and the SOC after the aging deterioration, particularly in the low SOC region, and thus the low SOC region is removed from the application range of the two-dimensional map, and the application range is limited to only the intermediate SOC region and the high SOC region. With regard to the low SOC region, the SOC is calculated using other known methods, without the use of the two-dimensional map. By limiting the application range of the two-dimensional map stored in the storage unit 6 to the intermediate SOC region and the high SOC region, it is possible to calculate the SOC without significantly reducing the precision, the precision of the charging/discharging control of the secondary battery 10 can be maintained and excessive charging and excessive discharging can be prevented, and the usage period of the secondary battery 10 can be extended.

A preferred embodiment of the present invention has been described. However, the present invention is not limited to the preferred embodiment, and various modifications may be made.

For example, in the preferred embodiment, the judging unit 7 judges the change of the capacity balance by judging the increase in the internal resistance DCIR at the low SOC region or the internal resistance DCIR at the high SOC region, but alternatively, the judging unit 7 may judge the change in the capacity balance when the judging unit 7 judges the increase in the internal resistance DCIR at the low SOC region and in the internal resistance DCIR in the high SOC region. In other words, the change of the capacity balance region may be judged when the increase in at least one of the internal resistance DCIR at the low SOC region and the internal resistance DCIR at the high SOC region is judged.

In addition, in the preferred embodiment, the change of the capacity balance is judged at an arbitrary timing. However, as shown in FIG. 4C, the increase in the internal resistance DCIR in the low SOC region or the high SOC region is particularly significant under a low temperature condition, and thus the change of the capacity balance may be judged by judging the increase in the internal resistance at the low SOC region or the internal resistance DCIR at the high SOC region when the temperature from the temperature sensor 13 is less than or equal to a predetermined temperature (for example, 0° C.). A similar configuration may be applied to a case where the change of the capacity balance is judged using the no-load voltage.

Moreover, in the preferred embodiment, the change of the capacity balance is judged based on the change of the internal resistance DCIR from the initial state or the change of the no-load voltage from the initial state. In addition to these, the change of the capacity balance may be judged using a temperature change of the secondary battery 10 from the initial state, a change of the internal pressure of the secondary battery 10 from the initial state, a change of gas constituent of the secondary battery 10 from the initial state, or a change of an amount of gas of the secondary battery 10 from the initial state. FIG. 8 shows an example of these changes. FIG. 8A shows the temperature change of the secondary battery 10 from the initial state, FIG. 8B shows the change of the internal pressure of the secondary battery 10 from the initial state, FIG. 8C shows the change of amount of gas of the secondary battery 10 from the initial state, and FIG. 8D shows the change of the gas constituent of the secondary battery 10 from the initial state. In these figures, the initial state and the state after degradation are shown. In the preferred embodiment, a battery of the cathode regulation in the initial state is described, but the change of the capacity balance between the cathode and the anode may be judged for a battery of anode regulation based on an idea similar to that for the cathode regulation battery.

Moreover, in the preferred embodiment, when it is judged that the capacity balance of the secondary battery 10 has changed, the control is changed such that the application range of the two-dimensional map is limited to the intermediate SOC region and the high SOC region. Alternatively, it is also possible to judge that the secondary battery 10 has been degraded when it is judged that the capacity balance has changed. The judgment result that the secondary battery 10 has been degraded is supplied from the judging unit 7 to the vehicle ECU 20. The vehicle ECU 20 notifies the vehicle driver or maintenance crew of the dealer by switching ON a warning lamp or the like according to the judgment result.

Furthermore, in the preferred embodiment, when it is judged that the capacity balance of the secondary battery 10 has changed, the application range of the two-dimensional map is limited. In place of this configuration or in addition to this configuration, it is also possible to change the center of control of the secondary battery 10 or change the upper and lower limits of the control of the SOC. For example, the control center of the secondary battery 10 may be changed, from 50% to 60%.

In addition, in the preferred embodiment, it is possible to judge whether or not the capacity balance has changed for each battery block. Thus, it is possible, in the case where the secondary battery 10 is removed from the vehicle, disassembled, and re-assembled for reuse as a new secondary battery, to understand the change of the capacity balance for each battery block and collect the battery blocks having a capacity balance change of similar degree for reassembly. In other words, the judgment result of the capacity balance change in the preferred embodiment can be used as a judgment standard for reassembling the secondary battery 10. In the preferred embodiment, the change of the capacity balance is judged for each battery block, but alternatively, the change of the capacity balance may be judged for each battery module by measuring the voltage and current for each battery module which is a part of the secondary battery 10.

What is claimed is:

1. A state judging device of a secondary battery, the device comprising:
   a unit which measures a voltage of a secondary battery;
   a unit which measures a current of the secondary battery;
   a unit which supplies a calculated internal resistance of the secondary battery based on the measured voltage and the measured current;
   a unit which supplies a calculated SOC of the secondary battery;
   a unit programmed to store an initial relationship characteristic and SOC defined as a function of internal resistance with respect to SOC regions when an SOC region to be used is divided into a low SOC region, an intermediate SOC region, and a high SOC region of an initial state of the secondary battery, the initial state corresponding to a state wherein a capacity balance between a cathode and an anode is set wherein one of capacities of the anode and the cathode is greater than a capacity of the other one by a predetermined value;
   a unit programmed to store a calculated relationship characteristic defined as a function of the calculated internal resistance with respect to the calculated SOC after a period has elapsed for the secondary battery; and
   a unit programmed to judge a change of the capacity balance between the cathode and the anode of the secondary battery from the initial state when the calculated relationship characteristic changes from the initial relationship characteristic.

2. The state judging device according to claim 1, wherein the judging unit judges the change of the capacity balance between the cathode and the anode of the secondary battery based on a change of the internal resistance in at least one of a relatively low SOC region and a relatively high SOC region with respect to the internal resistance in a relatively intermediate SOC region.

3. The state judging device according to claim 1, wherein the judging unit judges the change of the capacity balance between the cathode and the anode of the secondary battery based on a change of the internal resistance in at least one of a relatively low SOC region and a relatively high SOC region with respect to an initial state.

4. The state judging device according to claim 1, wherein the judging unit judges the change of the capacity balance between the cathode and the anode of the secondary battery based on whether or not an amount of change or a percentage of change of the internal resistance in at least one of a relatively low SOC region and a relatively high SOC region with respect to an initial state is greater than or equal to a predetermined value, and whether or not an amount of change or a percentage of change of the internal resistance in a relatively intermediate SOC region with respect to an initial state is less than the predetermined value.

5. The state judging device according to claim 1, further comprising:
   a unit which detects a temperature of the secondary battery, wherein
   the judging unit judges the change of the capacity balance between the cathode and the anode of the secondary battery when the temperature is less than or equal to a predetermined temperature.

6. A state judging device of a secondary battery, the device comprising:
   a unit which measures a voltage of a secondary battery;
   a unit which measures a current of the secondary battery;
   a unit which supplies a calculated no-load voltage of the secondary battery based on the measured voltage and the measured current;
   a unit which supplies a calculated SOC of the secondary battery;
   a unit programmed to store an initial relationship characteristic and SOC defined as a function of no-load voltage with respect to SOC regions when an SOC region to be used is divided into a low SOC region, an intermediate SOC region, and a high SOC region of an initial state of the secondary battery, the initial state corresponding to a state wherein a capacity balance between a cathode and an anode is set wherein one of capacities of the anode and the cathode is greater than a capacity of the other one by a predetermined value;
   a unit programmed to store a calculated relationship characteristic defined as a function of the calculated no-load voltage with respect to the calculated SOC after a period has elapsed for the secondary battery; and
   a unit programmed to judge a change of the capacity balance between the cathode and the anode of the secondary battery from the initial state when the calculated relationship characteristic changes from the initial relationship characteristic.

7. The state judging device according to claim 6, wherein the judging unit judges the change of the capacity balance between the cathode and the anode of the secondary battery based on a change of the no-load voltage in a relatively low SOC region with respect to an initial state.

8. The state judging device according to claim 6, further comprising:
   a unit which detects a temperature of the secondary battery, wherein
   the judging unit judges the change of the capacity balance between the cathode and the anode of the secondary battery when the temperature is less than or equal to a predetermined temperature.

9. A control device of a secondary battery, comprising:
   the state judging device according to claim 1, and
   a unit which changes a manner of controlling charging/discharging of the secondary battery when it is judged that the capacity balance between the cathode and the anode of the secondary battery has changed based on a judgment result by the state judging device.

10. The control device according to claim 9, wherein the changing unit changes the manner of controlling charging/discharging of the secondary battery by changing an application range of a map which defines a relationship between a no-load voltage and an SOC and which is stored in a storage unit in advance for calculating the SOC of the secondary battery.

11. A control device of a secondary battery, comprising:
the state judging device according to claim 6, and
a unit which changes a manner of controlling charging/discharging of the secondary battery when it is judged that the capacity balance between the cathode and the anode of the secondary battery has changed based on a judgment result by the state judging device.

12. The control device according to claim 11, wherein
the changing unit changes the manner of control controlling charging/discharging of the secondary battery by changing an application range of a map which defines a relationship between a no-load voltage and an SOC and which is stored in a storage unit in advance for calculating the SOC of the secondary battery.

13. The state judging device according to claim 1, wherein the unit which judges the change judges a reverse of the capacity balance between the cathode and the anode from the initial state.

14. The state judging device according to claim 1, wherein the unit which judges the change judges, as the change of the capacity balance, a capacity difference between the cathode and the anode is smaller than the predetermined value.

* * * * *